United States Patent [19]

Olson et al.

[11] 4,352,839

[45] Oct. 5, 1982

[54] METHOD OF FORMING A LAYER OF POLYMETHYL METHACRYLATE ON A SURFACE OF SILICON DIOXIDE

[75] Inventors: Daniel R. Olson; Bruce F. Griffing, both of Schenectady; James F. Norton, Alplaus, all of N.Y.

[73] Assignee: General Electric Company, Schenectady, N.Y.

[21] Appl. No.: 267,101

[22] Filed: May 26, 1981

[51] Int. Cl.³ .............................................. B05D 3/12
[52] U.S. Cl. ..................................... 427/240; 427/96; 427/299; 427/385.5; 427/389.7; 427/393.6
[58] Field of Search .................. 427/240, 389.7, 385.5, 427/299, 96, 393.6

[56] References Cited

U.S. PATENT DOCUMENTS

| | | | |
|---|---|---|---|
| 3,573,950 | 4/1971 | Domicone | 427/299 |
| 3,652,333 | 3/1972 | Warren | 427/96 |
| 3,911,169 | 10/1975 | Lesaicherre et al. | 427/299 |
| 4,268,610 | 5/1981 | Roos | 427/96 |

*Primary Examiner*—Michael R. Lusignan
*Assistant Examiner*—Janyce A. Bell
*Attorney, Agent, or Firm*—Julius J. Zaskalicky; James C. Davis, Jr.; Marvin Snyder

[57] ABSTRACT

A method of enhancing the adhesion of polymethyl methacrylate to a surface of silicon dioxide utilizing a solution of carboxylic acid is described.

9 Claims, No Drawings

METHOD OF FORMING A LAYER OF POLYMETHYL METHACRYLATE ON A SURFACE OF SILICON DIOXIDE

The present invention relates to a method of forming a layer of polymethyl methacrylate on a surface of silicon dioxide.

Polymethyl methacrylate, referred to as PMMA, is commonly used as component of a two layer resist in photolithographic processes for the fabrication of integrated circuits. The two layer resist consists of a thick bottom layer of PMMA applied to the substrate to be processed and a thin top layer of another suitable positive resist material. The lower surface of the thick bottom layer of PMMA conforms to the topography of the substrate and the upper surface thereof is planar. The lower and upper surface of the thin top layer of resist are planar. The top layer of the two layer resist is exposed to a pattern of radiation to which it is sensitive and to which the bottom layer is not sensitive. The exposed portions of the top layer are removed by a suitable solvent or developer leaving retained portions of the top layer. Next, the bottom layer of the two layer resist is exposed through the openings in the top layer to radiation to which it is sensitive and the exposed portions of the bottom layer are removed by a suitable solvent or developer leaving retained portions of the bottom layer. Thereafter the patterned thick bottom layer of PMMA is used as a mask for performing such operations as etching in the underlying substrate. Such applications of PMMA in the fabrication of integrated circuits, as described above, requires that PMMA adhere well to many different materials of which silicon dioxide is the most common in the form of either a discrete layer or a film formed on various elements of the integrated circuit. However, as PMMA does not adhere well to silicon dioxide, it is difficult to form a patterned layer of PMMA on a silicon dioxide surface reliably and consistently, particularly where the retained portions of the PMMA layer are of small dimensions, for example, where line widths of submicron dimensions and having a height of several times the width thereof are formed. Also, retained portions of the PMMA layer having poor adhesion to the silicon dioxide surface are subject to damage and dislocation in the utilization thereof in the processing of the underlying substrate.

A principal of the present invention is to provide a method for enhancing the adhesion of polymethyl methacrylate to silicon dioxide surfaces.

In carrying out the method of the present invention in accordance with an embodiment thereof, a substrate having a surface of silicon dioxide is provided. A solution of acetic acid is deposited on the surface of silicon dioxide. The substrate is then spun at a speed and for a time to spread the solution over the surface uniformly and ultimately to dry the surface. Next, a solution of polymethyl methacrylate is deposited on the surface. The substrate is again spun at speed and for a time to form a layer of polymethyl methacrylate on the surface. Thereafter, the substrate with the layer of polymethyl methacrylate is heated at a temperature and for a time to remove any residue of solvent in the layer of polymethyl methacrylate.

The method of the present invention will be described in connection with a specific example. A substrate of silicon semiconductor material with a layer of silicon dioxide formed thereon was provided. A dilute solution of acetic acid consisting of 7 parts of acetic acid and 93 parts of water by volume was deposited on the exposed surface of the layer of silicon dioxide. The substrate was next placed in a spin coating apparatus wherein the substrate was spun in air at room temperatures at a speed of about 5000 rpm (revolutions per minute) for about 20 seconds to cause the solution of acetic acid to spread out over the entire surface of the layer of silicon dioxide and ultimately to dry the surface. Next, a solution of polymethyl methacrylate consisting of 8 parts of polymethyl methacrylate (DuPont Elvacite 2041) and 92 parts of toluene by weight was deposited on the surface of the layer of silicon dioxide. The substrate was then spun at a speed of about 5000 rpm for about 15 seconds to form a layer of polymethyl methyacrylate about 0.8 micron thick on the surface of the layer of silicon dioxide. Thereafter, the substrate was heated at a temperature of about 170° C. for a period of 20 minutes to remove any residue of toluene in the layer of PMMA and to enhance the adhesion of the layer of PMMA to the surface of the layer of silicon dioxide. The temperature of heating was chosen to be less than the temperature at which significant decomposition of polymer occurs.

In applying the method of the present invention to structures of polycrystalline silicon including an overlying layer of silicon dioxide, lines of widths of about 0.5 micron and lengths of the order of several microns and having a height of the order of three times the width of the lines were formed consistently with good adherence to the surface of the layer of silicon dioxide. Such islands or retained portions were transferred to the underlying layer of polycrystalline silicon by plasma etching with excellent fidelity.

While the solution of acetic acid was spread over the surface of silicon dioxide and thereafter the surface was dried by spinning the substrate, other ways of exposing the substrate to the solution may be utilized, such as spraying the solution thereon and subsequently evaporating the solution therefrom.

While a specific spinning speed and time was used to uniformly spread out the acetic acid solution on the substrate, it will be understood that other combinations of spinning speed and time may be used.

While water was used as the solvent in the acetic acid solution, other solvents such as toluene may be used.

While a specific dilute solution of acetic acid was used other solutions of various concentrations may be utilized as well.

While a specific solution of polymethyl methacrylate in toluene was utilized in the example described above, other solvents may be utilized, for example, chlorobenzene. Also, while a solution having a specific percentage of about 8 percent by weight of polymethyl methacrylate in solvent was used, other percentages of solute may be used. Also, while a specific Dupont Elvacite 2041 type of polymethyl methacrylate, other types may also be utilized. It is well known that the thickness of a layer of PMMA formed on a substrate is a function of the concentration of and type of PMMA in solution and the speed of spinning.

While acetic acid was used in the solution for treating the surface of the layer of silicon dioxide in the example described above, other carboxylic acids, for example, formic, propionic and butyric acids, and mixtures thereof, may be utilized.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. A method of forming a layer of polymethyl methacrylate on a surface of silicon dioxide of a substrate comprising:

treating said surface of silicon dioxide with a solution of carboxylic acid and thereafter drying said surface, depositing a solution of polymethyl methacrylate on the treated surface of silicon dioxide, spinning said substrate with said solution of polymethyl methacrylate on said surface of silicon dioxide at a speed and for a time to spread said solution over said surface and to remove the solvent of said solution of polymethyl methacrylate thereby forming said layer of polymethyl methacrylate on said surface of silicon dioxide, heating said layer of polymethyl methyacrylate on said surface of silicon dioxide at a temperature and for a time to remove residue of the solvent of said solution of polymethyl methacrylate in said layer of polymethyl methacrylate.

2. The method of claim 1 in which said carboxylic acid is acetic acid.

3. The method of claim 2 in which said surface of silicon dioxide of said substrate is treated with said solution of acetic acid by depositing said solution of acetic acid on said surface of silicon dioxide and thereafter spinning said substrate at a speed and for a time to dry said surface of silicon dioxide.

4. The method of claim 2 in which the solvent of said acetic acid solution is water.

5. The method of claim 2 in which said solvent of said acetic acid solution is toluene.

6. The method of claim 2 in which said solution of acetic acid is a dilute solution.

7. The method of claim 1 in which the solvent of said solution of polymethyl methacrylate is toluene.

8. The method of claim 1 in which the solvent of said solution of polymethyl methacrylate is chlorobenzene.

9. The method of claim 1 in which the heating of said substrate is done at a temperature less than the temperature at which significant decomposition of polymethyl methacrylate occurs.

* * * * *